(12) United States Patent
Kawashiro (10) Patent No.: US 12,154,865 B2
(45) Date of Patent: Nov. 26, 2024

(54) POWER SEMICONDUCTOR DEVICE INCLUDING A SEMICONDUCTOR CHIP

(71) Applicants: Kabushiki Kaisha Toshiba, Tokyo (JP); Toshiba Electronic Devices & Storage Corporation, Tokyo (JP)

(72) Inventor: Fumiyoshi Kawashiro, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 290 days.

(21) Appl. No.: 17/673,007

(22) Filed: Feb. 16, 2022

(65) Prior Publication Data

US 2023/0081341 A1 Mar. 16, 2023

(30) Foreign Application Priority Data

Sep. 13, 2021 (JP) ................. 2021-148893

(51) Int. Cl.
*H01L 23/31* (2006.01)
*H01L 23/00* (2006.01)
*H01L 23/495* (2006.01)

(52) U.S. Cl.
CPC ........ *H01L 23/562* (2013.01); *H01L 23/3114* (2013.01); *H01L 23/4952* (2013.01); *H01L 23/49562* (2013.01); *H01L 23/49582* (2013.01)

(58) Field of Classification Search
CPC ............... H01L 23/3114; H01L 23/051; H01L 23/49555; H01L 23/49586; H01L 2224/33181; H01L 23/3107; H01L 23/49562

See application file for complete search history.

(56) References Cited

U.S. PATENT DOCUMENTS

| | | | |
|---|---|---|---|
| 6,693,350 B2 | 2/2004 | Teshima et al. | |
| 6,774,466 B1* | 8/2004 | Kajiwara | H01L 24/97 |
| | | | 257/E23.044 |
| 9,337,113 B2* | 5/2016 | Asai | H01L 24/29 |
| 10,373,889 B2* | 8/2019 | Ooshima | H01L 25/112 |
| 10,615,103 B2* | 4/2020 | Inoue | H01L 23/49548 |

(Continued)

FOREIGN PATENT DOCUMENTS

| | | |
|---|---|---|
| JP | H11-26672 A | 1/1999 |
| JP | 2001156219 A | 6/2001 |

(Continued)

OTHER PUBLICATIONS

Office Action issued on Jun. 14, 2024, in corresponding Japanese Application No. 2021-148893, 6 pages.

*Primary Examiner* — Khiem D Nguyen
(74) *Attorney, Agent, or Firm* — Maier & Maier, PLLC (57) ABSTRACT

A semiconductor device according to the present embodiment comprises a semiconductor chip comprising a first face and a second face on an opposite side to the first face, and comprising a first electrode in the first face. A first metallic member comprises a first opposed face facing the first electrode and being larger in a profile than the first electrode, the first metallic member comprising a first protruded portion protruded from the first opposed face toward the first electrode and electrically connected to the first electrode. An insulating member coats the semiconductor chip and the first metallic member.

19 Claims, 10 Drawing Sheets

(56) References Cited

U.S. PATENT DOCUMENTS

| | | | | |
|---|---|---|---|---|
| 2002/0192460 A1* | 12/2002 | Kawaguchi | ............... | C23F 1/18 |
| | | | | 427/407.1 |
| 2014/0264383 A1 | 9/2014 | Kajiwara et al. | | |
| 2018/0277462 A1* | 9/2018 | Takahagi | ............ | H01L 23/3114 |
| 2020/0294895 A1* | 9/2020 | Ohta | ..................... | H01L 23/492 |
| 2020/0395259 A1* | 12/2020 | Miyachi | ............... | H05K 3/3426 |

FOREIGN PATENT DOCUMENTS

| | | | |
|---|---|---|---|
| JP | 4260263 | B2 | 4/2009 |
| JP | 2009-206343 | A | 9/2009 |
| JP | 2014179541 | A | 9/2014 |
| JP | 2020198388 | A | 12/2020 |

* cited by examiner

POWER SEMICONDUCTOR DEVICE INCLUDING A SEMICONDUCTOR CHIP

CROSS REFERENCE TO RELATED APPLICATIONS

This application is based upon and claims the benefit of priority from the prior Japanese Patent Application No. 2021-148893, filed on Sep. 13, 2021, the entire contents of which are incorporated herein by reference.

FIELD

The embodiments of the present invention relate to a semiconductor device.

BACKGROUND

Some power semiconductor devices used in in-vehicle DC-DC (Direct Current-Direct Current) converters and the like are configured in a package such as a DFN (Dual Flat Package) or a SOP (Small Outline Package). To reduce the on-resistance (Ron) in the package of these power semiconductor devices, a metallic member called "connector" or "clip" is used instead of a metallic wire for connection between an electrode and a lead frame.

However, when the size of a semiconductor chip is changed, the size of the metallic member such as a connector also needs to be changed. Using plural types of metallic members having different sizes causes deterioration of the productivity in a semiconductor manufacturing process.

DETAILED DESCRIPTION

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor device according to the present embodiment comprises a semiconductor chip comprising a first face and a second face on an opposite side to the first face, and comprising a first electrode in the first face. A first metallic member comprises a first opposed face facing the first electrode and being larger in a profile than the first electrode, the first metallic member comprising a first protruded portion protruded from the first opposed face toward the first electrode and electrically connected to the first electrode. An insulating member coats the semiconductor chip and the first metallic member.

First Embodiment

Figure 1A:
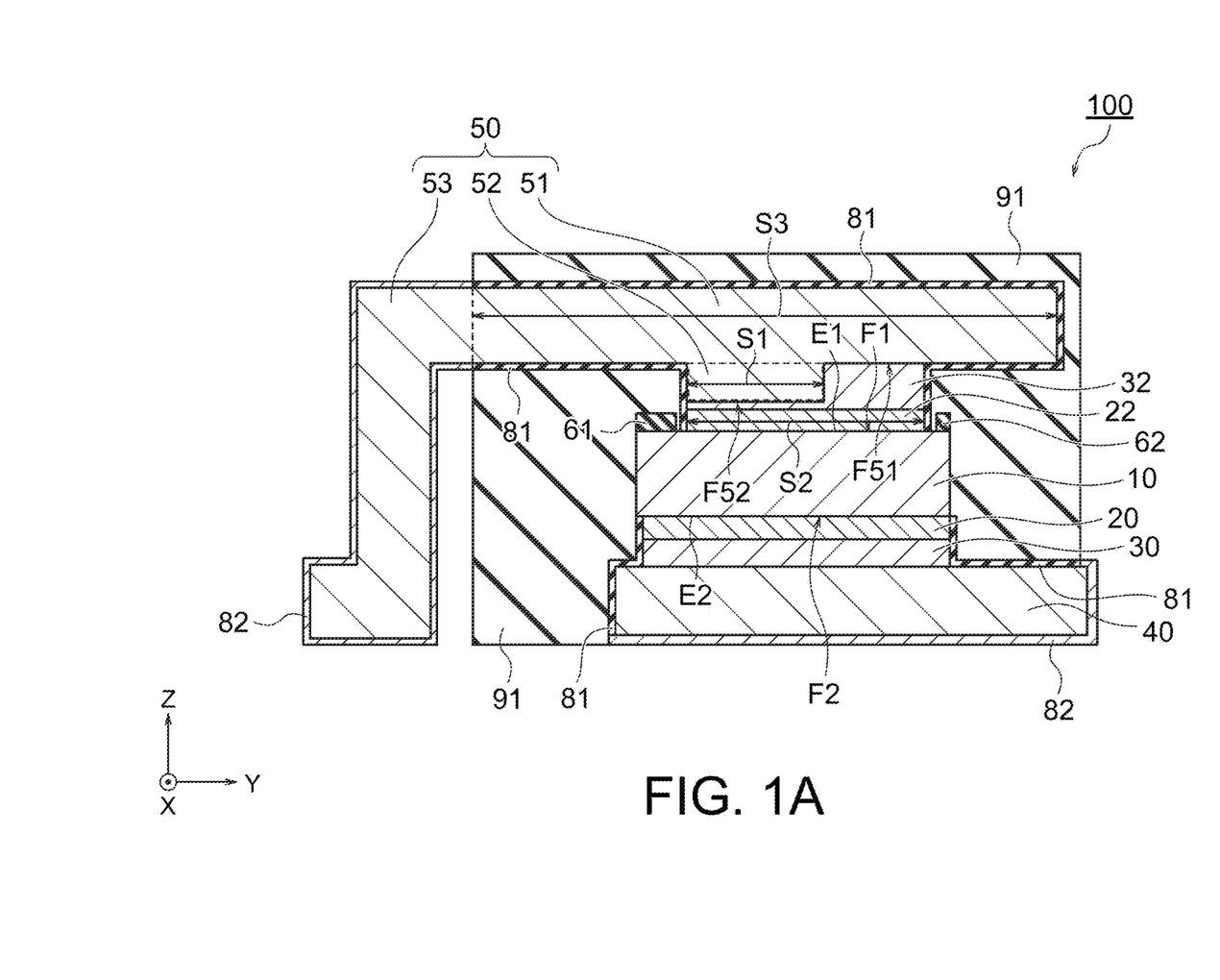
FIG. 1A is a sectional view illustrating a configuration example of a semiconductor device.
Figure 1B:
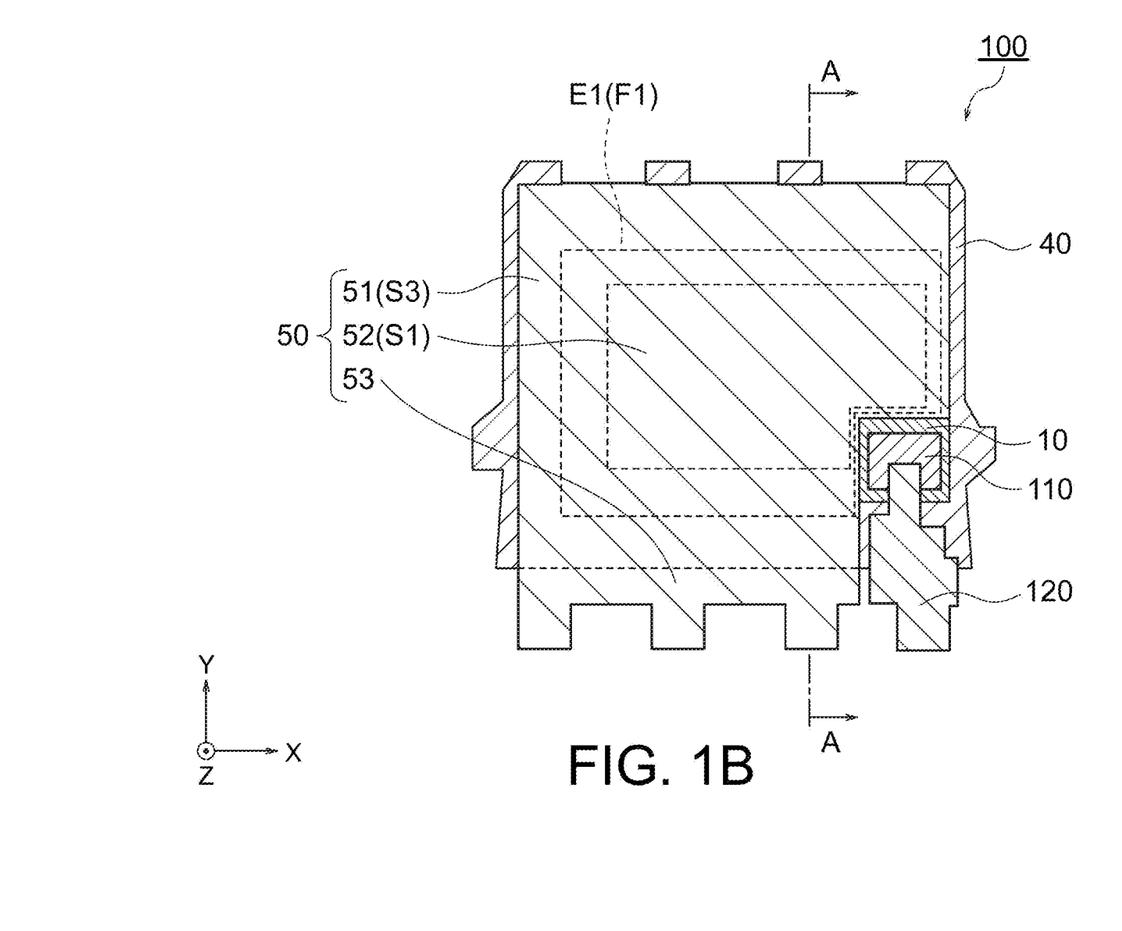
FIG. 1B is a plan view illustrating the configuration example of the semiconductor device.

FIG. 1A is a sectional view illustrating a configuration example of a semiconductor device 100. FIG. 1B is a plan view illustrating the configuration example of the semiconductor device 100. Illustrations of a resin layer 91 are omitted in FIG. 1B. FIG. 1A illustrates a cross section of the semiconductor device 100 along a line A-A in FIG. 1B. The semiconductor device 100 includes a semiconductor chip 10, a lower plated layer 20, an upper plated layer 22, a lower sinter material 30, an upper sinter material 32, a lead frame 40, a connector 50, solder resists 61 and 62, an adhesion improving film 81, an external plated layer 82, and the resin layer 91. The semiconductor device 100 is used, for example, in an in-vehicle DC-DC converter and may be a power semiconductor device that performs switching of a relatively large current. In the present specification, the stacking direction of the lead frame 40, the semiconductor chip 10, and the connector 50 is a Z direction, one direction substantially orthogonal to the Z direction is an X direction, and a direction substantially orthogonal to the X direction and the Z direction is a Y direction.

The semiconductor chip 10 has a first face F1 including a first electrode E1, and a second face F2 being on the opposite side to the first face F1 and including a second electrode E2. The first electrode E1 is coated with the upper plated layer 22. The second electrode E2 is coated with the lower plated layer 20. The semiconductor chip 10 is capable of passing a large current between the first electrode E1 and the second electrode E2 as a semiconductor element. The semiconductor chip 10 may be, for example, a power semiconductor element such as an IGBT (Insulated Gate Bipolar Transistor) or a HEMT (High Electron Mobility Transistor). The semiconductor chip 10 may be, for example, a MOSFET (Metal Oxide Semiconductor Field Effect Transistor). For example, silicon (Si), silicon carbide (SiC), or gallium nitride (GaN) is used as a substrate of the semiconductor chip 10. When the semiconductor device 100 is a power semiconductor element such as an IGBT or a HEMT, the first electrode E1 corresponds to an emitter electrode and the second electrode E2 corresponds to a collector electrode. When the semiconductor device 100 is a MOSFET, the first electrode E1 corresponds to a source electrode and the second electrode E2 corresponds to a drain electrode.

The lower plated layer 20 is provided under the second face F2 to coat the second electrode E2 and to be electrically connected to the second electrode E2. The lower plated layer 20 is an example of a fourth conductive member. For example, any of copper, nickel, silver, gold, and palladium (Pd) is used as the lower plated layer 20. For example, when the lower plated layer 20 is made of copper, for example, about 5 micrometers (μm) suffices as the thickness of the lower plated layer 20. However, the lower plated layer 20 desirably has a similar thickness to that of the upper plated layer 22 to suppress wafer warpage.

The lower sinter material 30 is provided under the lower plated layer 20. The lower sinter material 30 is an example of a third conductive member. For example, any of copper, silver, lead, a tin-copper compound, a tin-silver compound, and a tin-nickel compound is used as the lower sinter material 30. The lower sinter material 30 is a paste-like or sheet-like material in the initial time of supply and is sintered between the lead frame 40 and the second electrode E2 by thermal treatment.

The lead frame 40 is provided under the lower sinter material 30. The lead frame 40 is an example of a second metallic member. For example, a conductive material such as copper is used as the lead frame 40. In this way, the lower plated layer 20 and the lower sinter material 30 are provided between the second electrode E2 and the lead frame 40 and electrically connect the second electrode E2 and the lead frame 40 to each other.

The upper plated layer 22 is provided on the first face F1 to coat the first electrode E1 and to be electrically connected to the first electrode E1. The upper plated layer 22 is an example of a second conductive member. For example, a material including any of copper, nickel, silver, gold, and palladium is used as the upper plated layer 22. For example, when the upper plated layer 22 is made of copper, for example, about 5 μm suffices as the thickness of the upper plated layer 22. However, the upper plated layer 22 desirably has a similar thickness (for example, about 20 μm) to that of the lower plated layer 20 to suppress warpage of the substrate of the semiconductor chip 10. The upper plated layer 22 and the lower plated layer 20 also have a function as supports for the semiconductor chip 10. Therefore, with the similar thicknesses of the upper plated layer 22 and the lower plated layer 20, the semiconductor device 100 has a balanced configuration. The first electrode E1 is surrounded by the solder resists 61 and 62 on the first face F1, and the inner part of a region surrounded by the solder resists 61 and 62 is coated with the upper plated layer 22. Accordingly, the upper plated layer 22 has a substantially similar area S2 to that of the first electrode E1 in an X-Y plane.

The upper sinter material 32 is provided on the upper plated layer 22. The upper sinter material 32 is an example of a first conductive member. For example, any of copper, silver, lead, a tin-copper compound, a tin-silver compound, and a tin-nickel compound is used as the upper sinter material 32. The upper sinter material 32 is a paste-like or sheet-like material in the initial time of supply and is sintered between the connector 50 and the first electrode E1 by thermal treatment.

The connector 50 is provided on the upper sinter material 32. The connector 50 is an example of a first metallic member. For example, a conductive material such as copper is used as the connector 50. In this way, the upper plated layer 22 and the upper sinter material 32 are provided between the connector 50 and the first electrode E1 and electrically connect the first electrode E1 and the connector 50 to each other.

The resin layer 91 seals the semiconductor chip 10, the connector 50, the lower plated layer 20, the lower sinter material 30, the upper plated layer 22, the upper sinter material 32, and the lead frame 40 and protects these parts from outside the resin layer 91. The resin layer 91 is an example of an insulating member. For example, resin is used as the resin layer 91.

The adhesion improving film 81 is provided between the connector 50 and the resin layer 91 and between the lead frame 40 and the resin layer 91. The adhesion improving film 81 improves the adhesion property between the resin layer 91 and the connector 50 (for example, copper) and suppresses detachment of the connector 50 from the resin layer 91. The adhesion improving film 81 is an example of a first coat. When the connector 50 is formed of, for example, copper, the adhesion improving film 81 is, for example, an azole compound and is formed of a material including two or more of nitrogen, carbon, oxygen, chromium (Cr), zirconium (Zr,) and silicon as components. The film thickness of the adhesion improving film 81 is, for example, 10 to 100 nanometers (nm).

The external plated layer 82 coats a first external terminal 53 and the bottom surface of the lead frame 40. The external plated layer 82 is an example of a fifth conductive member. For example, tin (Sn) is used. The external plated layer 82 facilitates mounting of the semiconductor device 100 on a substrate or the like. To enable the external plated layer 82 to be melted without melting the upper sinter material 32 and the lower sinter material 30 in thermal treatment at the time of mounting of the semiconductor device 100, the melting point of the external plated layer 82 is preferably lower than those of the upper sinter material 32 and the lower sinter material 30.

The connector 50 is explained in more detail next.

The connector 50 includes a flat portion 51, a protruded portion 52, and the first external terminal 53. The flat portion 51, the protruded portion 52, and the first external terminal 53 are all constituted of a same material and are integrally formed. For example, a conductive material such as copper is used as the connector 50.

The flat portion 51 is a flat member extending in an X-Y plane and has a larger profile than the first electrode E1 in the X-Y plane. The flat portion 51 has a first opposed face F51 facing the first electrode E1, and the area of the first opposed face F51 is larger than the area of the surface of the first electrode E1. The first opposed face F51 has an area S3 in the X-Y plane and the surface of the first electrode E1 has an area S2.

The protruded portion 52 is protruded toward the first electrode E1 from the first opposed face F51 of the flat portion 51 and is electrically connected to the first electrode E1. The protruded portion 52 has a second opposed face F52 facing the first electrode E1. The second opposed face F52 has an area S1 in the X-Y plane. The protruded portion 52 may be in direct contact with the upper plated layer 22 on the second opposed face F52. Alternatively, the upper sinter material 32 may be provided between the protruded portion 52 and the upper plated layer 22.

The first external terminal 53 is integral with the flat portion 51 and is protruded continuously from the flat portion 51 to outside the resin layer 91. The first external terminal 53 is bent in a −Z direction from the flat portion 51 to extend from the level of the flat portion 51 to the level of the lead frame 40.

The flat portion 51, the protruded portion 52, and the first external terminal 53 are integrally formed to be seamless and continuous and there is no joint part therebetween. Accordingly, even when stress is applied to the first external terminal 53 at the time of mounting of the semiconductor device 100, the first external terminal 53 is not cut off from the flat portion 51. The resin layer 91 is not provided around the first external terminal 53. Since the first external terminal 53 can freely warp in this case, the first external terminal 53 can easily absorb the stress.

The area S1 of the second opposed face F52 of the protruded portion 52, the area S2 of the surface of the first electrode E1, and the area S3 of the first opposed face F51 are explained next. The second opposed face F52 of the protruded portion 52 is provided to connect to the first electrode E1 or the upper plated layer 22. Therefore, the second opposed face F52 of the protruded portion 52 is in the range of the first electrode E1 in a planar view seen from the Z direction and the area S1 is equal to or smaller than the area S2.

The first opposed face F51 is preferably larger than the semiconductor chip 10 to improve heat dissipation. Therefore, the area S3 of the first opposed face F51 is larger than the area S2 of the surface of the first electrode E1. That is, the areas S1 to S3 in ascending order of the size are S1, S2, and S3 (S1≤S2<S3).

When the area S1 of the second opposed face F52 of the protruded portion 52 is smaller than the area S2 of the first electrode E1, there is a concern about an increase in the contact resistance between the connector 50 and the first electrode E1. However, the conductive upper sinter material 32 is provided between the flat portion 51 and the first electrode E1 (or the upper plated layer 22) other than the protruded portion 52 in the present embodiment. Therefore, the first electrode E1 and the connector 50 can be electrically connected to each other with a low resistance.

The area S2 of the first electrode E1 can have any dimension as long as the area S2 is equal to or larger than the area S1 of the second opposed face F52 of the protruded portion 52. In power semiconductor devices, the area S2 of the first electrode E1 depends on the dimension of the semiconductor chip 10 itself. Therefore, the semiconductor chip 10 has any dimension as long as the area S2 of the first electrode E1 is equal to or larger than the area S1 of the second opposed face F52 of the protruded portion 52. That is, the connector 50 can be applied to various semiconductor chips having the first electrode E1 equal to or larger than the area S1. This enables the same connector 50 to be adopted in cases where the versatility of the connector 50 is enhanced and the size of the semiconductor chip 10 is changed. This improves the manufacturing efficiency of the semiconductor device 100 and leads to cost reduction.

The planar shape of the semiconductor device 100 is explained next.

As illustrated in FIG. 1B, the semiconductor chip 10 further includes a gate electrode 110 electrically isolated from the first electrode E1 in a planar view seen from above (the Z direction of) the first face F1. The gate electrode 110 is an example of a control electrode. The flat portion 51 of the connector 50 has a shape where one corner of a substantial rectangle is notched in the planar view seen from the Z direction to connect a second external terminal 120 to the gate electrode 110. As necessary, the protruded portion 52 of the connector 50 may also have a shape where one corner of a substantial rectangle is notched in the planar view. This enables the second external terminal 120 to be arranged on the gate electrode 110 adjacently to the connector 50. The second external terminal 120 is electrically isolated from the connector 50. The second external terminal 120 can be, for example, a metallic terminal including a conductive material such as gold (Au), copper, or aluminum (Al), or may be a bonding wire including a similar conductive material.

According to the present embodiment, the flat portion 51 of the connector 50 has the protruded portion 52 on the second opposed face F52. The area S1 of the second opposed face F52 of the protruded portion 52 is smaller than the area S3 of the first opposed face F51 of the flat portion 51 and can be connected to the first electrodes E1 of the semiconductor chips 10 of various sizes. Therefore, the versatility of the connector 50 is high and the same connector 50 can be adopted for the semiconductor chips 10 of various sizes. This increases the manufacturing efficiency of the semiconductor device 100 and leads to cost reduction.

While the area S1 of the second opposed face F52 of the protruded portion 52 is smaller than the area S2 of the first electrode E1, the upper sinter material 32 is provided between the flat portion 51 other than the protruded portion 52 and the first electrode E1. Accordingly, the first electrode E1 and the connector 50 can be electrically connected to each other with a relatively low resistance. The upper sinter material 32 fills a space between the first opposed face F51 other than the protruded portion 52 and the surface of the first electrode E1, and can suppress an increase in the contact resistance caused by a difference between the area S1 of the second opposed face F52 of the protruded portion 52 and the area S2 of the first electrode E1.

The area S3 of the first opposed face F51 is larger than the area S2 of the surface of the first electrode E1. Accordingly, the heat dissipation of the first opposed face F51 can be improved.

In a case in which the upper plated layer 22, the lower plated layer 20, the upper sinter material 32, the lower sinter material 30, the lead frame 40, and the connector 50 are made of copper, the adhesion improving film 81 improves the adhesion between copper and the resin layer 91. This suppresses detachment and the like of these components from the resin layer 91 and improves the reliability of the semiconductor device 100.

The area S3 of the flat portion 51 of the connector 50 is larger than the area S2 of the first electrode E1 and is larger than the area of the first face F1 of the semiconductor chip 10. Accordingly, the ratio of the material (for example, copper) of the connector 50 in the semiconductor device 100 is increased and physical properties (the linear expansion coefficient, the specific heat, the electrical conductivity, and the like) approach those of copper, for example. In a case in which a mounting board on which the semiconductor device 100 is mounted has lines made of the same material (for example, copper) as that of the connector 50, the mounting board includes a multilayer line (for example, a copper line) and has physical properties close to those of copper. Therefore, the physical affinity between the semiconductor device 100 and the mounting board is increased and the reliability of long-time mounting of the semiconductor device 100 is improved.

The distance between the upper surface of the lead frame 40 and the opposed face F50 of the connector 50 is, for example, equal to or larger than 60 µm. Therefore, a breakdown voltage can be ensured for an application voltage at about 600 volts (V).

A manufacturing method of the semiconductor device 100 is explained next.

Figure 2:
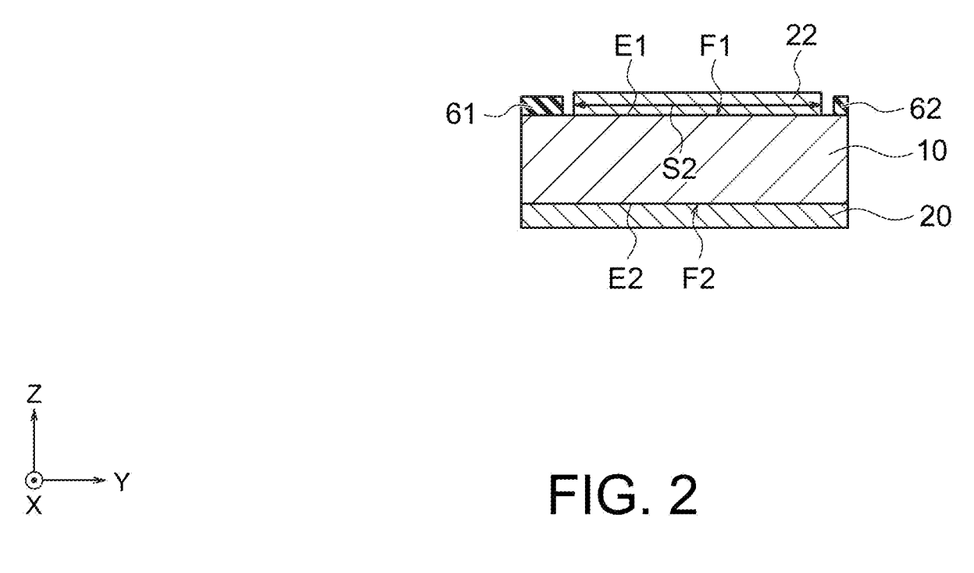
FIGS. 2 to 8 are sectional views illustrating an example of the manufacturing method of the semiconductor device according to the first embodiment.

FIGS. 2 to 8 are sectional views illustrating an example of the manufacturing method of the semiconductor device 100 according to the first embodiment. First, as illustrated in FIG. 2, the semiconductor chip 10 including the first electrode (the first face F1) E1 and the second electrode (the second face F2) E2 is prepared. The semiconductor chip 10 includes a semiconductor substrate including, for example, silicon, silicon carbide, or gallium nitride, and semiconductor elements formed on the semiconductor substrate. The upper plated layer 22 is formed on the first electrode E1. The lower plated layer 20 is formed on the second electrode E2.

Figure 3:
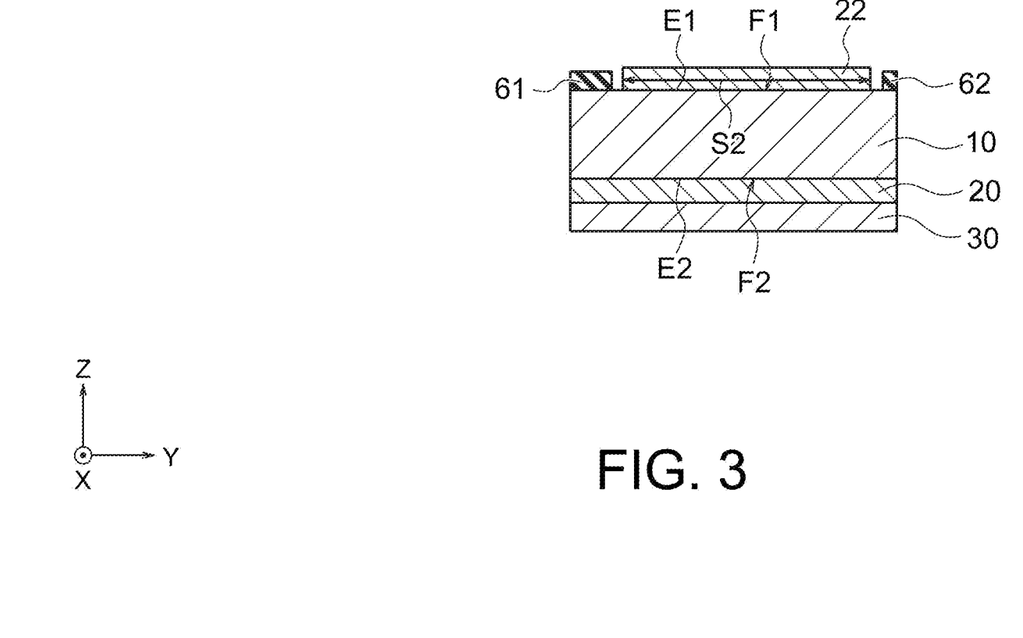

Next, the lower sinter material 30 is formed under the lower plated layer 20 of the semiconductor chip 10 as illustrated in FIG. 3. The lower sinter material 30 may be formed by applying paste-like copper to the lower plated layer 20, or may be formed by attaching sheet-like copper to the lower plated layer 20.

The lower sinter material 30 may be applied or attached onto the lead frame 40. The lower sinter material 30 may be applied or attached onto the lead frame 40 and the lower plated layer 20 of the semiconductor chip 10 may be bonded to the lower sinter material 30. The adhesion improving film 81 may be formed in advance on the entire surface of the lead frame 40. This can shorten the manufacturing process. The adhesion improving film 81 is, for example, an azole compound.

Figure 4:
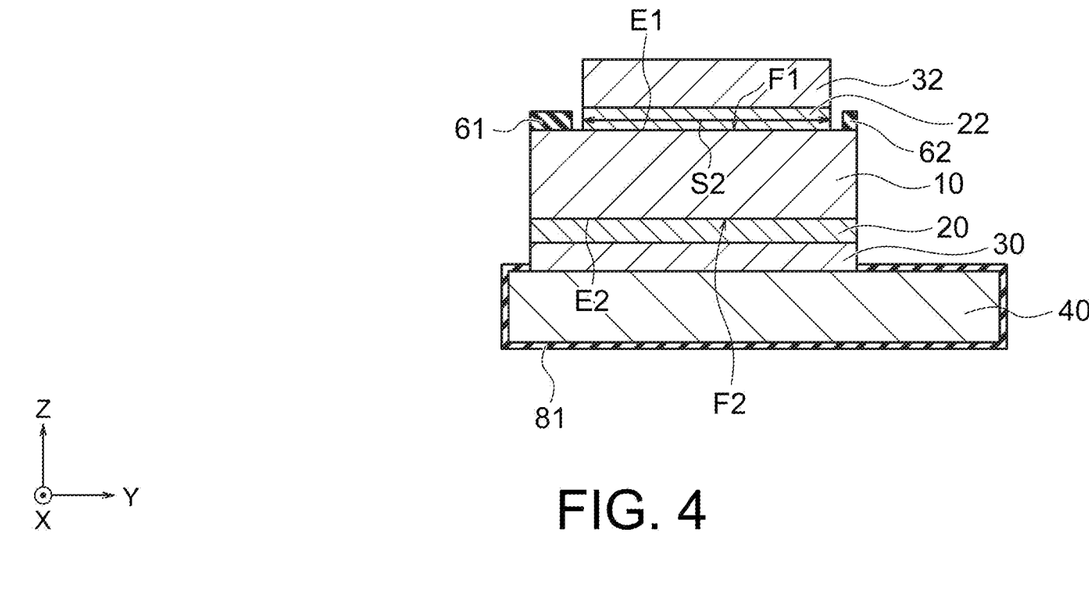

Next, as illustrated in FIG. 4, the semiconductor chip 10 is bonded onto the lead frame 40 with the lower sinter material 30 interposed therebetween. The bonding of the semiconductor chip 10 and the lead frame 40 may be performed by pressurizing and heating in an inert atmosphere, or may be performed by heating without pressurizing. The heating temperature may be, for example, 200 to 350° C. Accordingly, the lower sinter material 30 is sintered and cured and fixes the semiconductor chip 10 onto the lead frame 40.

Next, a paste-like upper sinter material 32 is applied on the upper plated layer 22 as illustrated in FIG. 4. Alternatively, a sheet-like sinter material 32 is attached to the upper plated layer 22.

Figure 5:
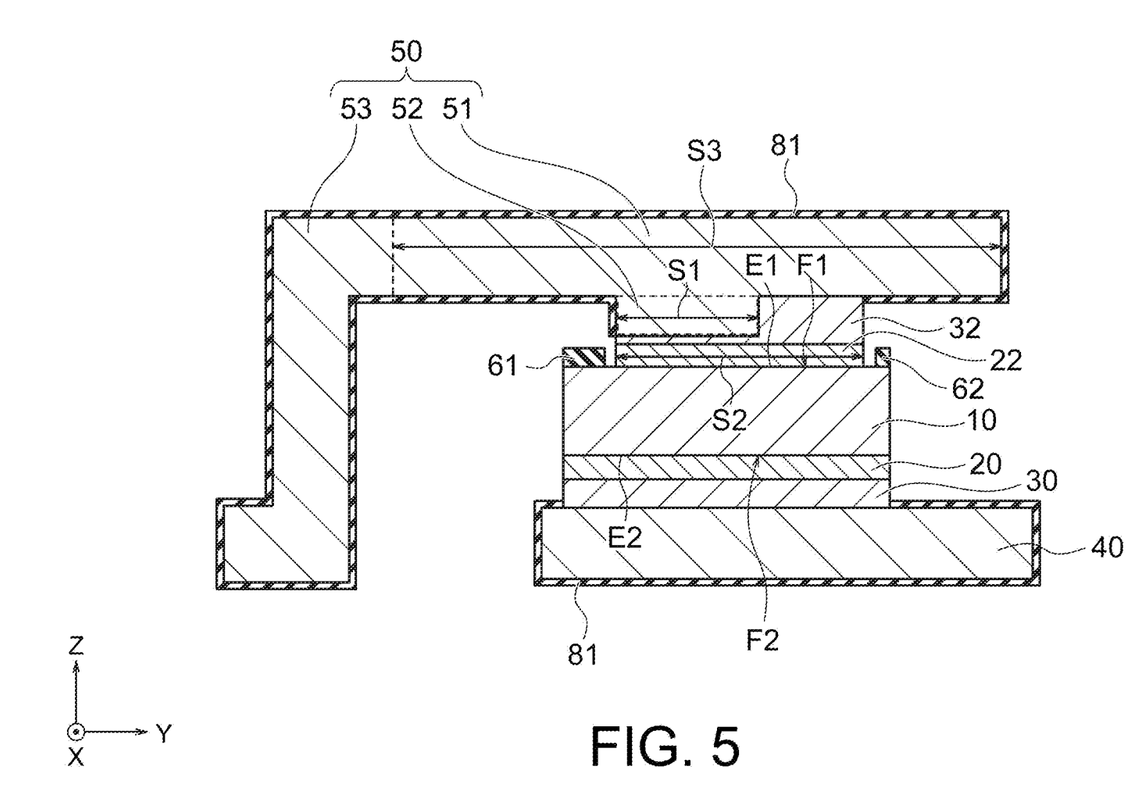

Next, the connector 50 is bonded onto the upper sinter material 32 as illustrated in FIG. 5. In this case, the protruded portion 52 is bonded in such a manner that the second opposed face F52 faces the upper plated layer 22. Accordingly, the connector 50 and the first electrode E1 are electrically connected to each other. The bonding of the connector 50 and the upper sinter material 32 may be performed by pressurizing and heating in an inert atmosphere, or may be performed by heating without pressurizing. The heating temperature is, for example, 200 to 350° C. Accordingly, the upper sinter material 32 is melted or fills a space between the first opposed face F51 other than the protruded portion 52 and the surface of the upper plated layer 22. This enables the connector 50 and the first electrode E1 to be more adequately electrically connected to each other. The adhesion improving film 81 may be formed in advance on the entire surface of the connector 50. This can shorten the manufacturing process.

Figure 6:
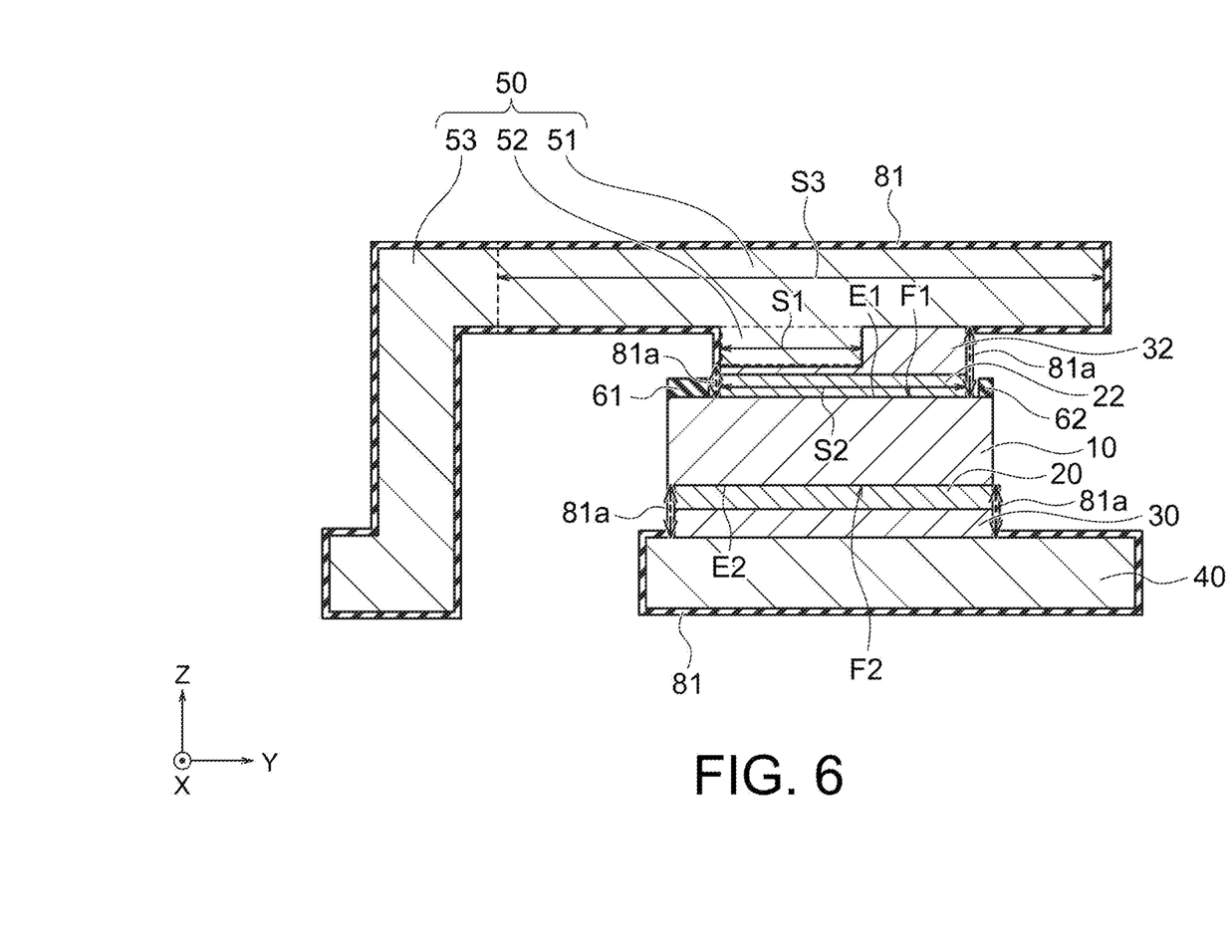

Next, as shown in FIG. 6, the adhesion improving film 81 is formed on exposed surfaces of the lead frame 40, the connector 50, the upper sinter material 32, the lower sinter material 30, the upper plated layer 22, and the lower plated layer 20. In the present embodiment, the lead frame 40, the connector 50, the upper sinter material 32, the lower sinter material 30, the upper plated layer 22, and the lower plated layer 20 are, for example, all made of copper. Therefore, the adhesion improving film 81 can be selectively formed on the exposed surfaces. The adhesion improving film 81 may be, for example, an azole compound.

Figure 7:
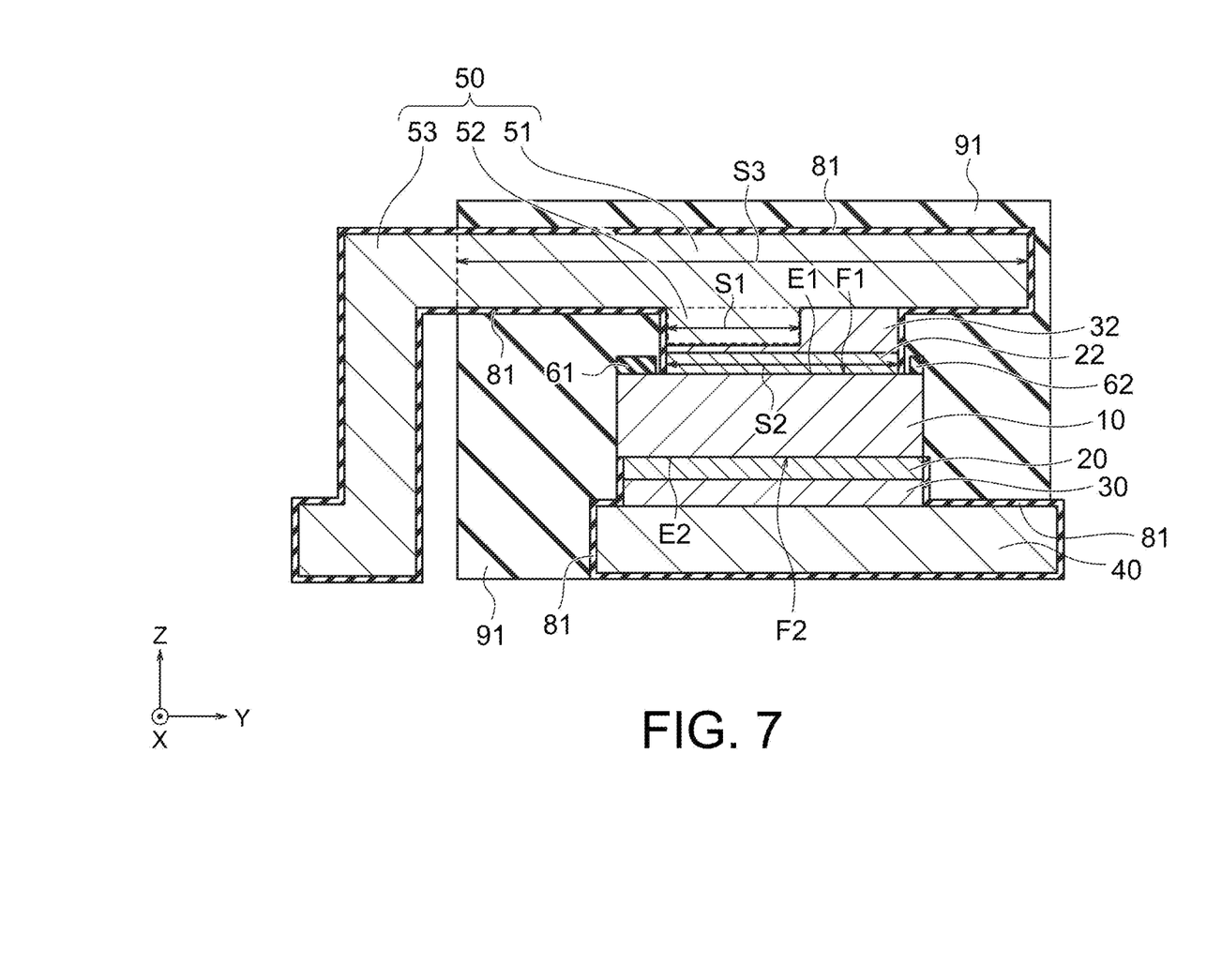

Next, as illustrated in FIG. 7, the resin layer 91 is formed to coat the semiconductor chip 10, the connector 50, the lower plated layer 20, the lower sinter material 30, the upper plated layer 22, the upper sinter material 32, and the lead frame 40. At this time, the surfaces of the lead frame 40, the connector 50, the upper sinter material 32, the lower sinter material 30, the upper plated layer 22, and the lower plated layer 20 are coated with the adhesion improving film 81. Therefore, the resin layer 91 can adequately tightly adhere to these components.

Figure 8:
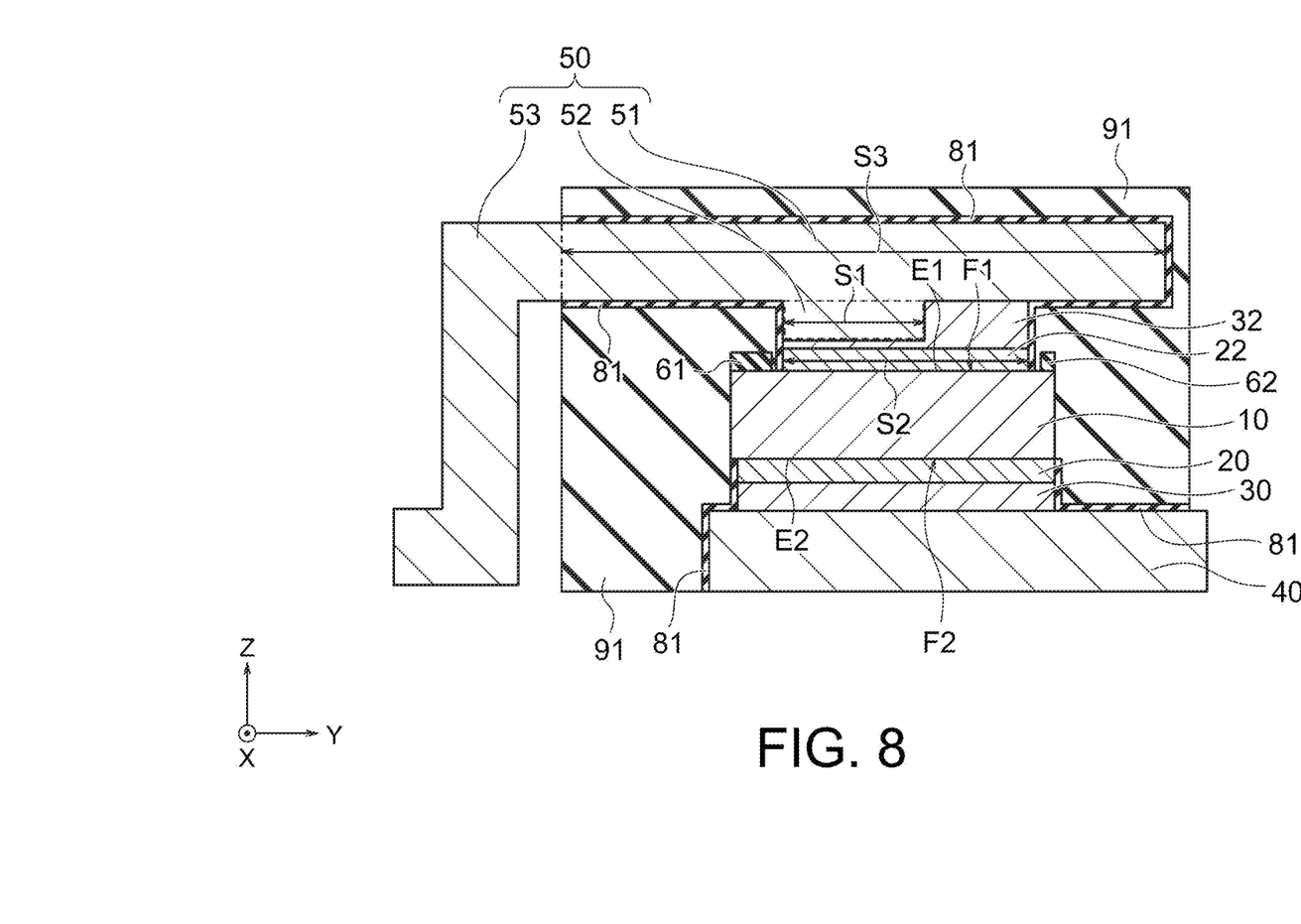

Next, the adhesion improving film 81 coating the first external terminal 53 and the surface of the lead frame 40 is removed with a phosphoric acid solution or the like as illustrated in FIG. 8. The adhesion improving film 81 on a rear surface portion of the lead frame 40, which is not coated with the resin layer 91, is removed.

Next, the first external terminal 53 and the surface of the lead frame 40 exposed by the removal of the adhesion improving film 81 are coated with the external plated layer 82 as illustrated in FIG. 1A. The external plated layer 82 is, for example, tin. The melting point of tin is lower than those of copper and the azole compound. Therefore, the adhesion improving film 81, the upper sinter material 32, and the lower sinter material 30 do not melt even in a case in which the external plated layer 82 is formed by heating. Accordingly, the configuration in the resin layer 91 can be maintained.

The semiconductor device 100 illustrated in FIG. 1A is obtained by the processes described above.

As described above, according to the first embodiment, the connector 50 has the protruded portion 52. Therefore, even when the area of the semiconductor chip 10 is changed, electrical connection using the common connector 50 can be performed and the manufacturing efficiency of the semiconductor device 100 can be enhanced. The connector 50, the lead frame 40, the lower plated layer 20, the lower sinter material 30, the upper plated layer 22, and the upper sinter material 32 are coated with the adhesion improving film 81 in a case of being formed of copper, for example. This improves the adhesion to the resin layer 91 and detachment of the configuration in the resin layer 91, such as the connector 50 and the lead frame 40, from the resin layer 91 can be suppressed. As a result, the reliability of the semiconductor device 100 is enhanced. Furthermore, the first external terminal 53 is protruded outside the resin layer 91 and has a so-called gull-wing shape. Therefore, the first external terminal 53 can absorb stress produced by substrate mounting and detachment of the connector 50 from the resin layer 91 can be suppressed. Consequently, the reliability of the semiconductor device 100 is further enhanced. By forming the area S3 of the flat portion 51 of the connector 50 to be larger than the area S2 of the semiconductor chip 10, the ratio of the material of the connector 50 in the semiconductor device 100 becomes high. This can increase the physical affinity between the semiconductor device 100 and the mounting board in a case in which the connector 50 and the lines of the mounting board are made of a same material (for example, copper). Accordingly, the reliability of long-time mounting of the semiconductor device 100 is improved.

Second Embodiment

Figure 9:
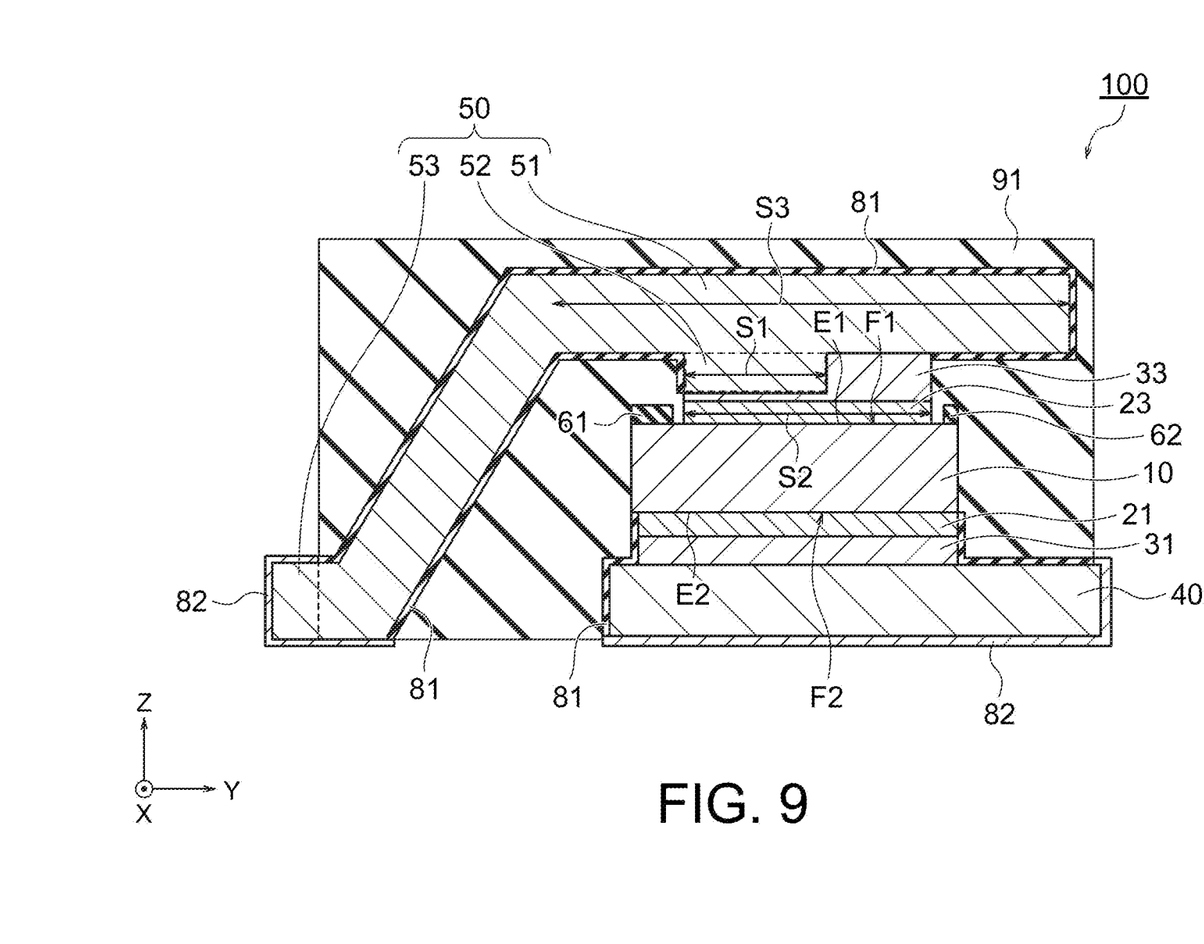
FIG. 9 is a sectional view illustrating a configuration example of the semiconductor device according to a second embodiment.

FIG. 9 is a sectional view illustrating a configuration example of the semiconductor device 100 according to a second embodiment. In the second embodiment, the first external terminal 53 is bent in a direction oblique to the Z direction from the flat portion 51 and extends from the level of the flat portion 51 to the level of the lead frame 40. The oblique portion of the first external terminal 53 is coated with the resin layer 91 and only a portion including a contact portion is exposed from the resin layer 91. The adhesion improving film 81 is provided between the first external terminal 53 coated with the resin layer 91 and the resin layer 91. The portion exposed from the resin layer 91 in the first external terminal 53 is coated with the external plated layer 82.

For example, any of copper, nickel (Ni), silver (Ag), gold, and palladium (Pd) can be used as a lower plated layer 21 and an upper plated layer 23. A material having a melting point equal to or higher than 300° C. is used as a lower sinter material 31 and an upper sinter material 33. For example, silver, lead (Pb), a tin-copper compound (CuSn), a tin-silver compound (AgSn), or a tin-nickel (SnNi) compound is used as the lower sinter material 31 and the upper sinter material 33.

Other configurations of the second embodiment may be identical to those of the first embodiment. Therefore, the second embodiment can obtain effects identical to those of the first embodiment. Further, the manufacturing method according to the second embodiment is identical to the manufacturing method according to the first embodiment.

While certain embodiments have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor chip comprising a first face and a second face on an opposite side to the first face, and comprising a first electrode in the first face;
a first metallic member comprising a first opposed face facing the first electrode and being larger in a profile than the first electrode, the first metallic member comprising a first protruded portion protruded from the first opposed face toward the first electrode and electrically connected to the first electrode; and
an insulating member coating the semiconductor chip and the first metallic member; and
a first conductive member provided between the metallic member and the semiconductor chip, wherein
the first conductive member includes a first surface and a second protruded portion, the first surface opposing to the first protruded portion and directly connecting to the first protruded portion, the second protruded portion being protruded from the first surface, and
a side surface of the second protruded portion directly connecting to a side surface of the first protruded portion.

2. The device of claim 1, further comprising a first coat provided between the first metallic member and the insulating member.

3. The device of claim 2, further comprising a second conductive member provided between the first metallic member and the first electrode and between the first conductive member and the first electrode, and coating the first electrode.

4. The device of claim 1, wherein an area of a second opposed face of the first protruded portion facing the first electrode is smaller than an area of the first electrode.

5. The device of claim 3, further comprising a second metallic member facing a second electrode in the second face of the semiconductor chip and being electrically connected to the second electrode.

6. The device of claim 5, further comprising a third conductive member and a fourth conductive member provided between the second electrode and the second metallic member.

7. The device of claim 1, wherein the first metallic member comprises a first connection terminal protruded outward from the insulating member.

8. The device of claim 7, wherein the first connection terminal is coated with a fifth conductive member lower in a melting point than the first conductive member.

9. The device of claim 1, wherein the first metallic member has a shape where one corner of a substantial rectangle is notched in a planar view seen from above the first face.

10. The device of claim 7, wherein the first metallic member from the first protruded portion to the first connection terminal is integrally formed of a same material.

11. The device of claim 5, wherein copper is used as the first metallic member and the second metallic member.

12. The device of claim 6, wherein any of copper, nickel, silver, gold, and palladium is used as the second conductive member and the fourth conductive member.

13. The device of claim 6, wherein any of copper, silver, lead, a tin-copper compound, a tin-silver compound, and a tin-nickel compound is used as the first conductive member and the third conductive member.

14. The device of claim 2, wherein an azole compound is used as the first coat.

15. The device of claim 8, wherein tin is used as the fifth conductive member.

16. The device of claim 6, wherein
the first coat coats the first metallic member, the second metallic member, and surfaces of the first to fourth conductive members,
when the first metallic member, the second metallic member, and the first to fourth conductive members include copper.

17. The device of claim 2, wherein a film thickness of the first coat is 10 nm to 100 nm.

18. The device of claim 1, further comprising:
a control electrode provided in the first face of the semiconductor chip and electrically isolated from the first electrode; and
a bonding wire connected to the control electrode.

19. The device of claim 1, wherein a top surface of the second protruded portion directly connects to the first metallic member.

* * * * *